US009293729B2

(12) United States Patent
Lee et al.

(10) Patent No.: US 9,293,729 B2
(45) Date of Patent: Mar. 22, 2016

(54) ORGANIC LIGHT EMITTING DIODE DISPLAY PACKAGE WITH SEALANT AND ADHESIVE REINFORCING MEMBER

(71) Applicant: SAMSUNG DISPLAY CO., LTD., Yongin, Gyeonggi-Do (KR)

(72) Inventors: Hong Ro Lee, Seongnam-si (KR); Yo Sub Ko, Ansan-si (KR); Beung Hwa Jeong, Cheonan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/459,451

(22) Filed: Aug. 14, 2014

(65) Prior Publication Data
US 2015/0102315 A1 Apr. 16, 2015

(30) Foreign Application Priority Data

Oct. 14, 2013 (KR) .................. 10-2013-0122084

(51) Int. Cl.
*H01L 51/52* (2006.01)
(52) U.S. Cl.
CPC .................. *H01L 51/5246* (2013.01)
(58) Field of Classification Search
CPC ............... H01L 27/1218; H01L 2227/326; H01L 2924/12044; H01L 51/525
See application file for complete search history.

(56) References Cited

U.S. PATENT DOCUMENTS

| 3,673,881 | A * | 7/1972 | Burke | 476/50 |
| 3,754,577 | A * | 8/1973 | Heller | 139/92 |
| 7,255,823 | B1 * | 8/2007 | Guenther et al. | 264/263 |
| 7,498,186 | B2 * | 3/2009 | Lee | 438/28 |
| 8,063,562 | B2 * | 11/2011 | Gomi | 313/512 |
| 8,379,179 | B2 * | 2/2013 | Kim et al. | 349/153 |
| 8,432,672 | B2 * | 4/2013 | Cho et al. | 361/679.21 |
| 8,552,642 | B2 * | 10/2013 | Logunov et al. | 313/512 |
| 2003/0062830 | A1 * | 4/2003 | Guenther et al. | 313/512 |
| 2004/0217703 | A1 * | 11/2004 | Wittmann et al. | 313/512 |
| 2005/0140913 | A1 * | 6/2005 | Yokota et al. | 349/153 |
| 2006/0063351 | A1 * | 3/2006 | Jain | 438/455 |
| 2007/0090759 | A1 * | 4/2007 | Choi et al. | 313/512 |
| 2007/0170324 | A1 * | 7/2007 | Lee et al. | 248/247 |
| 2007/0170605 | A1 * | 7/2007 | Lee et al. | 264/1.1 |
| 2007/0170839 | A1 * | 7/2007 | Choi et al. | 313/500 |
| 2007/0177069 | A1 * | 8/2007 | Lee | 349/56 |
| 2009/0066232 | A1 * | 3/2009 | Koo et al. | 313/504 |
| 2010/0102719 | A1 * | 4/2010 | Lee et al. | 313/512 |
| 2013/0112966 | A1 * | 5/2013 | Sassa | 257/40 |

FOREIGN PATENT DOCUMENTS

| KR | 10-0732817 B1 | 6/2007 |
| KR | 10-0995068 | 11/2010 |

* cited by examiner

*Primary Examiner* — Evan Pert
*Assistant Examiner* — Gustavo Ramallo
(74) *Attorney, Agent, or Firm* — Lee & Morse, P.C.

(57) ABSTRACT

An organic light emitting diode display may include a display substrate including an organic light emitting diode, a sealing member facing the display substrate to cover the organic light emitting diode, a sealant positioned between the display substrate and the sealing member and bonding the display substrate and the sealing member, and a reinforcing member positioned at an outer surface of the sealant and a space between the display substrate and the sealing member, in which shear stress and hardness of the reinforcing member are a function of a sum of thicknesses of the display substrate and the sealing member.

7 Claims, 9 Drawing Sheets

ORGANIC LIGHT EMITTING DIODE DISPLAY PACKAGE WITH SEALANT AND ADHESIVE REINFORCING MEMBER

CROSS-REFERENCE TO RELATED APPLICATION

Korean Patent Application No. 10-2013-0122084, filed on Oct. 14, 2013, in the Korean Intellectual Property Office, and entitled: "Organic Light Emitting Diode Display," is incorporated by reference herein in its entirety.

BACKGROUND

1. Field

The present application relates to an organic light emitting diode display.

2. Description of the Related Art

An organic light emitting diode display may include a plurality of organic light emitting diodes having hole injection electrodes, organic emission layers, and electron injection electrodes. Light may be emitted by energy generated when an exciton generated by coupling an electron and a hole in the organic emission layer moves from an excited state to a ground state, and the organic light emitting diode display may form an image by using the emitted light.

The above information disclosed in this Background section is only for enhancement of understanding of the background, and therefore it may contain information that is not prior art.

SUMMARY

An exemplary embodiment provides an organic light emitting diode display, including a display substrate including an organic light emitting diode, a sealing member facing the display substrate to cover the organic light emitting diode, a sealant positioned between the display substrate and the sealing member and bonding the display substrate and the sealing member, and a reinforcing member positioned at an outer surface of the sealant and a space between the display substrate and the sealing member. A shear strength and hardness of the reinforcing member may be a function of a sum of thicknesses of the display substrate and the sealing member.

The shear strength and the hardness of the reinforcing member may satisfy the following Equation 1.

$$X \geq \frac{(Y - B \times t + C)}{A} \quad \text{Equation 1}$$

The X may be shear strength multiplied by hardness of the reinforcing member, Y may be adhesion (kgf) between the display substrate and the sealing member, and t may be a sum of thicknesses of the display substrate and the sealing member, and A, B, and C may be constants.

The A may be about 0.0008 to about 0.0010.
The B may be about 6.0000 to about 7.40000.
The C may be about 0.7900 to about 0.9800.
The Y may be about 5.0 or more.

The outer surface of the sealant and an edge of the sealing member may be parallel to each other.

The sealant may include at least one of a frit and an epoxy resin.

A sum of thicknesses of the display substrate and the sealing member may be about 0.6 mm or less.

The sealant may be formed by a screen printing method.

The reinforcing member may be formed by capillary action.

The reinforcing member may have a decreased hardness when the reinforcing member includes an increased number of functional groups.

The reinforcing member may have an increased shear strength when the reinforcing member includes an increased content of urethane acrylate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
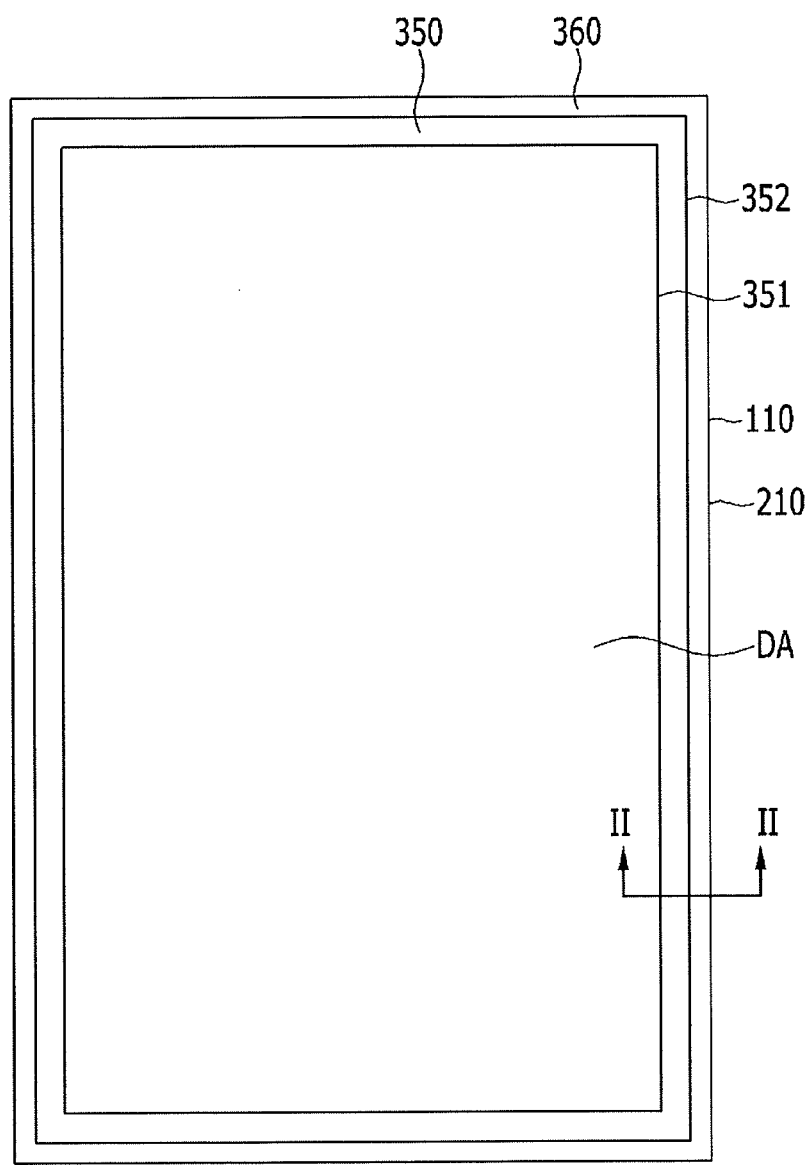
FIG. 1 illustrates a plan view of an organic light emitting diode display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers, films, panels, regions, etc., may be exaggerated for clarity. In the drawings, for understanding and ease of description, the dimensions of some layers and areas may be exaggerated. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, in the accompany drawings, an active matrix (AM) type organic light emitting diode display having a 2Tr-1Cap structure in which two thin film transistors (TFTs) and one capacitor are included in one pixel is illustrated, but the present embodiment is not limited thereto. Accordingly, the organic light emitting diode display may include three or more TFTs and two or more capacitors in one pixel, and may also be formed to have various structures in which a separate wiring is further formed. Here, the pixel is a minimum unit of displaying an image, and the organic light emitting diode display displays the image through the plurality of pixels.

Hereinafter, an exemplary embodiment will be described with reference to FIGS. 1 to 7.

Figure 2:
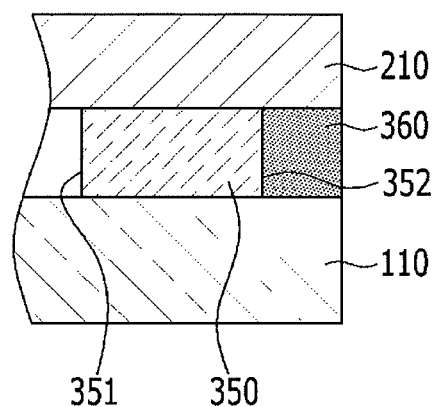
FIG. 2 illustrates a cross-sectional view of FIG. 1 taken along line II-II.

As illustrated in FIGS. 1 and 2, an organic light emitting diode display 10 according to an exemplary embodiment may include a display substrate 110, and a sealing member 210 facing the display substrate 110. In addition, the organic light emitting diode display 10 may further include a sealant 350 disposed between the display substrate 110 and the sealing member 210 to bond and seal the display substrate 110 and the sealing member 210, and a reinforcing member 360. In detail, the sealant 350 and the reinforcing member 360 may be formed along edges of the display substrate 110 and the sealing member 210.

The sealant 350 may bond the display substrate 110 and the sealing member 210, and may be a thermosetting or photo-curable adhesive and include a glass fit. However, embodiments are not limited thereto. Accordingly, the sealant 350 may be made of a material including epoxy resin, and may also be made of other various known materials.

As illustrated in FIG. 1, the sealant 350 may have an inner surface 351 and an outer surface 352 in one or more corner regions of the display substrate 110 and the sealing member 210. In FIG. 1, in all the corner regions of the display substrate 110 and the sealing member 210, the sealant 350 has an angled inner surface 351 and an angled outer surface 351, but the exemplary embodiment is not limited thereto and the sealant 350 may have a curved inner surface or outer surface.

A width of the sealant 350 may have a predetermined width in other regions except for the corner region of the display substrate 110 and the sealing member 210, and may have a slightly larger width in the corner region, although not illustrated in this specification. This may improve adhesion in the corner region.

In other regions except for the corner region of the display substrate 110 and the sealing member 210, the inner surface 351 and the outer surface 352 of the sealant 350 may be substantially parallel to each other. The sealant 350 may be formed by a screen printing method, but is not limited thereto.

As illustrated in FIG. 2, the organic light emitting diode display 10 may further include a reinforcing member 360 adjacent to the outer surface 352 of the sealant 350 to fill a space between the display substrate 110 and the sealing member 210. In order to fill the space, the reinforcing member 360 may be positioned at a narrow gap by capillary action.

The reinforcing member 360 may prevent the display substrate 110, the sealing member 210, and the sealant 350 from being easily broken, and may serve as an auxiliary sealant in the case where the sealant 350 made of a frit is fused and thus is not adhered, or adhesion is weak.

The reinforcing member 360 may include natural-curable, thermosetting, or ultraviolet (UV)-curable resins. For example, the natural-curable material may be cyanide acrylate, a material that is thermally cured at a temperature of less than 80° C., such as acrylate, and the ultraviolet-curable material may include epoxy, acrylate, or urethane acrylate. The materials may be coated in a liquid state and cured to form the reinforcing member 360. By such a configuration, the organic light emitting diode display 10 may have improved device strength, and may reduce defects from being generated in a manufacturing process.

Further, the reinforcing member 360 may include a material having a property to be described below. Hereinafter, appropriate adhesion may be obtained through hardness and shear strength of the reinforcing member 360, and the reinforcing member 360 may include a material satisfying necessary hardness and shear strength.

As an example, in order to enhance the hardness of the reinforcing member 360, the material may include a material including a large number of mono-functional groups.

Further, as an example, in order to enhance the shear strength of the reinforcing member 360, the material may have a large amount of oligomers including urethane acrylate and/or ester acrylate.

When bonding the display substrate 110 and the sealing member 210 using the reinforcing member 360 and the sealant 350, as thicknesses of the display substrate 110 and the sealing member 210 are decreased, the adhesion may be decreased.

Figure 3:
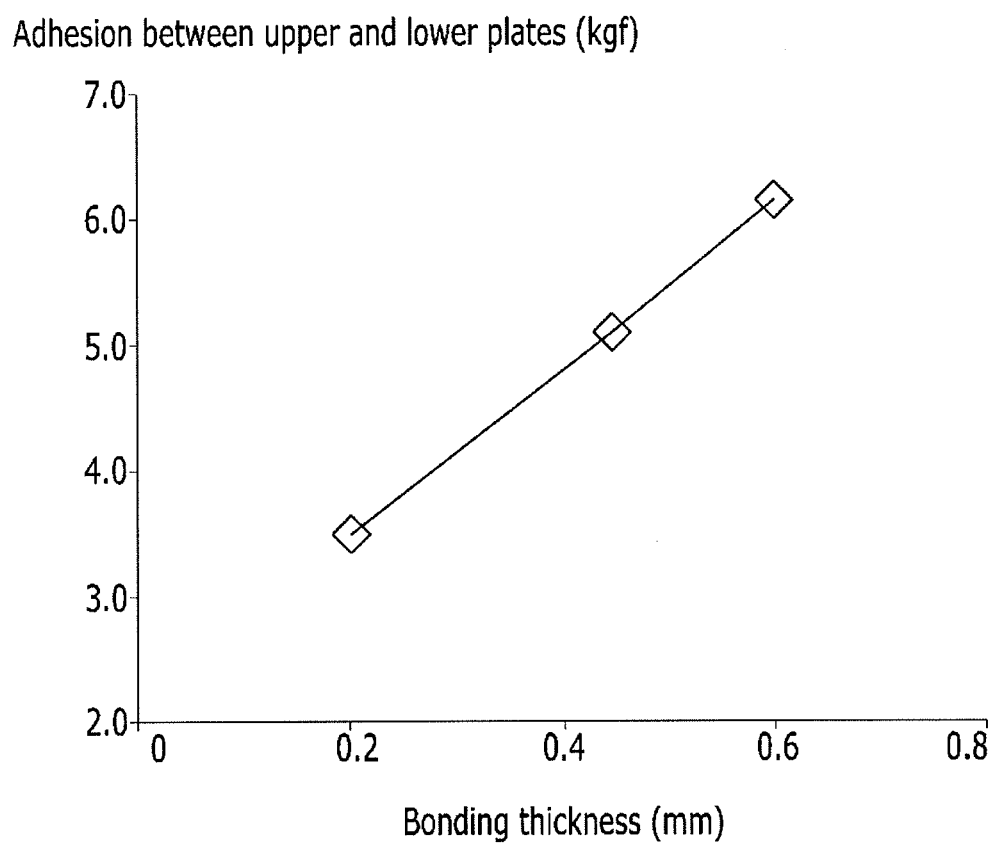
FIG. 3 illustrates a graph of adhesion for a sum of thicknesses of a substrate and a sealing member.

Referring to FIG. 3, when the display substrate having the large thickness (a sum of the thicknesses was 0.6 mm) is used, even in the case where force is applied in a vertical direction with hard and straight properties of glass, the force may be uniformly dispersed over the entire substrate, and the adhesion of about 6.0 kgf or more is shown.

However, the display substrate having a small thickness (about 0.2 mm) may be flexible. In the case where the force is applied in the vertical direction, the force may be concentrated at a predetermined point to which the corresponding force is applied, and thus the adhesion is shown as 4.0 kgf or less and becomes very weak. Hereinafter, the "adhesion" refers to an adhesion between the display substrate 110 and the sealing member 210.

Figure 4:
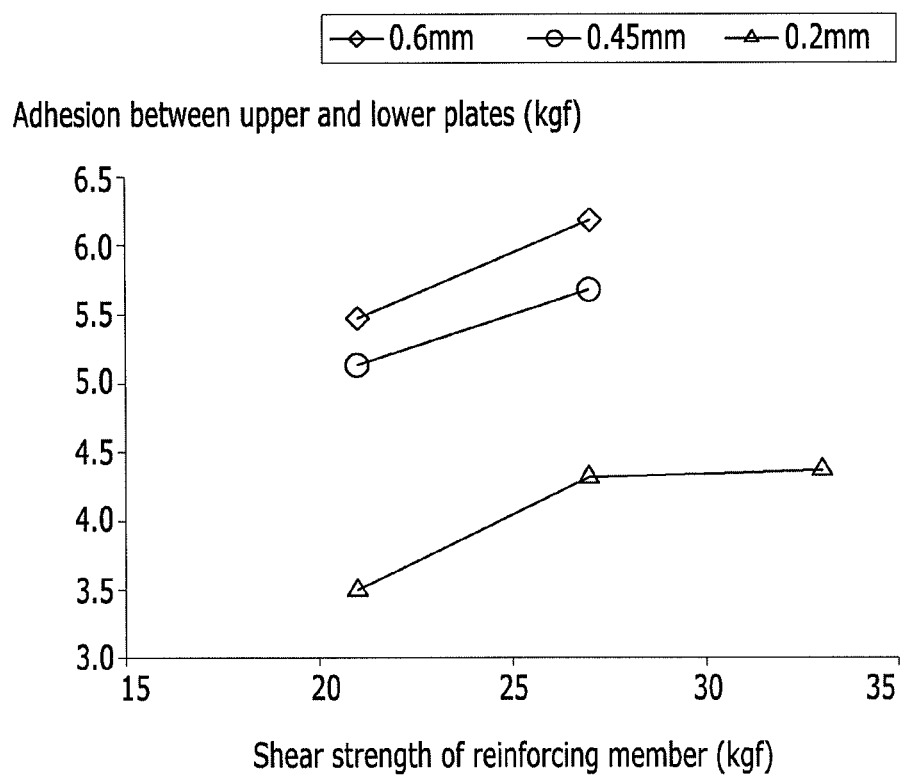
FIG. 4 illustrates a graph of adhesion for shear strength of a reinforcing member according to each thickness.

As such, decreases in adhesion may not be improved by increasing only shear strength of the reinforcing member as illustrated in FIG. 4. As shown in FIG. 4, when the shear strength of the reinforcing member is increased, when the adhesion is about 25 kgf or more, the adhesion does not continue to increase.

This aspect is shown in more detail in Table 1. Although the shear strength of the reinforcing member may be increased in the display substrate, the adhesion may remain at a predetermined level. In particular, when the sum of the thicknesses of the display substrate and the sealing member is 0.6 mm or less, the adhesion may be significantly decreased.

Referring to Table 1 and FIG. 4, adhesion required in a general display device may be at least 5.0 kgf, while very low adhesion is shown when the sum of the thicknesses of the display substrate and the sealing member is decreased.

TABLE 1

| Adhesion (kgf) | | Sum of thicknesses of display substrate and sealing member (mm) | | |
|---|---|---|---|---|
| | | 0.6 mm | 0.45 mm | 0.2 mm |
| Shear strength of reinforcing member | 21 kgf | 5.5 kgf | 5.1 kgf | 3.5 kgf |
| | 27 kgf | 6.2 kgf | 2.7 kgf | 4.3 kgf |
| | 33 kgf | — | — | 4.4 kgf |

Adhesion versus shear strength and hardness of the reinforcing member will be described in more detail with reference to the following Table 2 and FIGS. 5 to 7.

TABLE 2

| NO. | Shear strength (kgf) | Hardness (D) | Adhesion (kgf) |
|---|---|---|---|
| 1 | 21 | 70 | 3.52 |
| 2 | 27 | 80 | 4.34 |
| 3 | 30 | 95 | 4.81 |
| 4 | 33 | 75 | 4.39 |
| 5 | 33 | 82 | 4.72 |

Referring to Table 2, in Example 1 and Example 2, as the shear strength was increased by 6 kgf, the adhesion was significantly increased. However, in Example 2 and Example 4, the shear strength was increased by the same amount as described above, but the increase in the adhesion was beyond the increase in the shear strength.

Further, in Example 3 and Example 4, although the shear strength was larger in Example 4, the adhesion was larger in Example 3 by the difference in hardness.

Further, the shear strength was the same in Examples 4 and 5, but the adhesion was very different by the difference in hardness.

Figure 5:
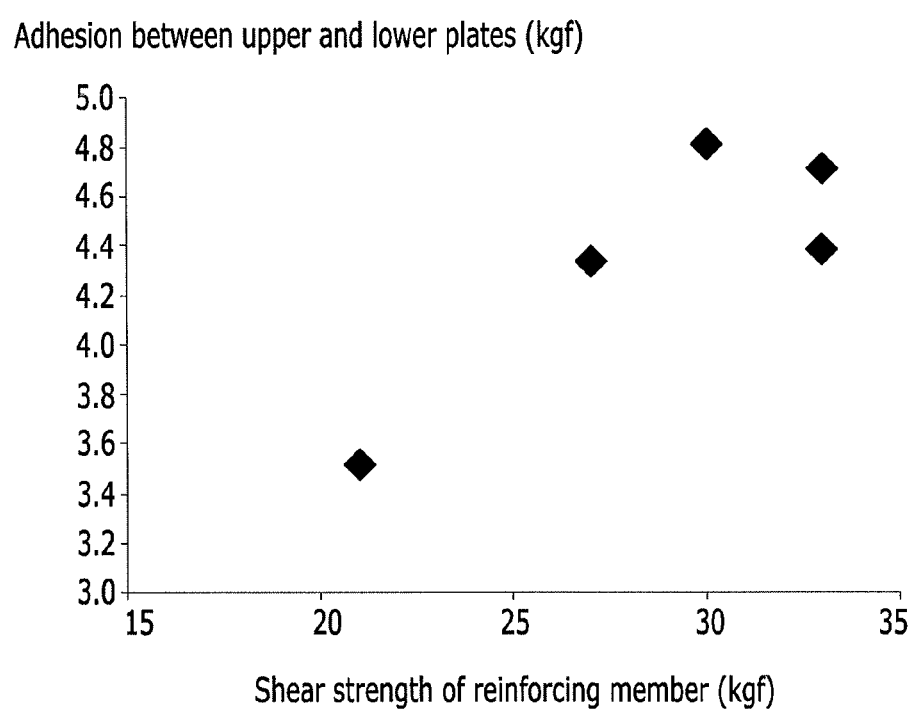
FIG. 5 illustrates a graph of adhesion for shear strength of the reinforcing member.
Figure 6:
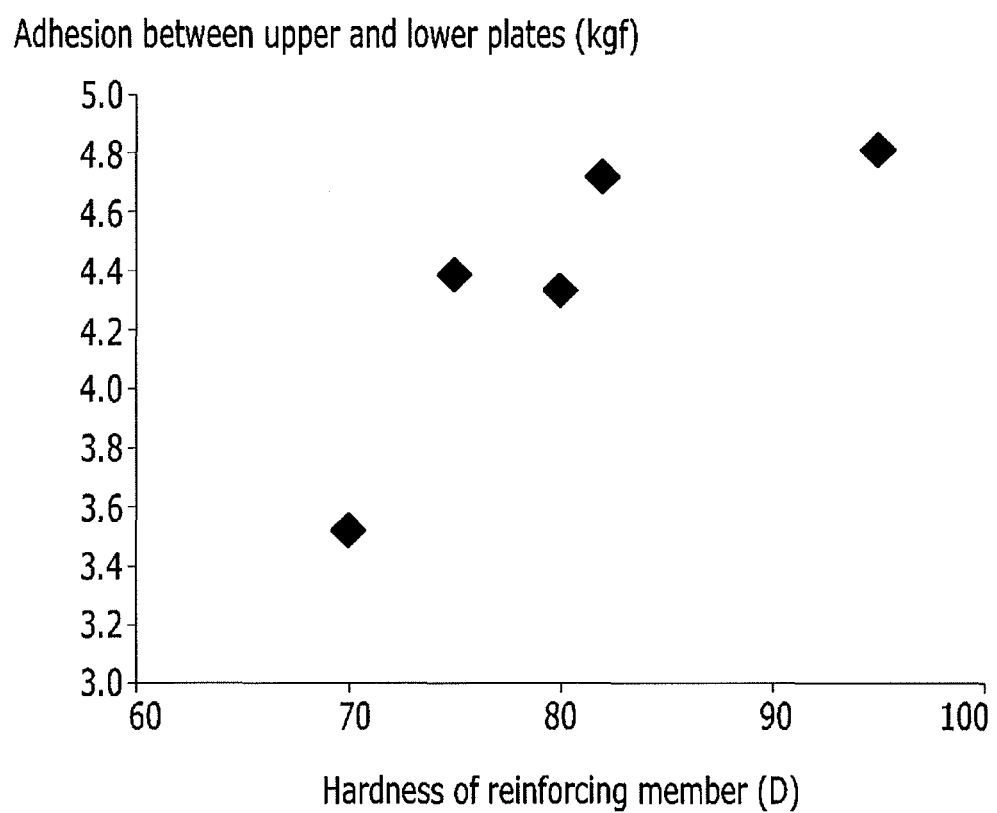
FIG. 6 illustrates a graph of adhesion for hardness of the reinforcing member.

As a result, as shown in FIGS. 5 and 6, the adhesion does not depend on only the shear strength or the hardness.

FIG. 5 illustrates adhesion versus shear strength of the reinforcing member. When the shear strength was continuously increased, the adhesion did not uniformly increase. Further, as shown in FIG. 6, although the hardness was continuously increased, the adhesion remained at a predetermined level or nonlinearly increased. That is, the adhesion is not a characteristic increased depending on only the shear strength or the hardness.

Figure 7:
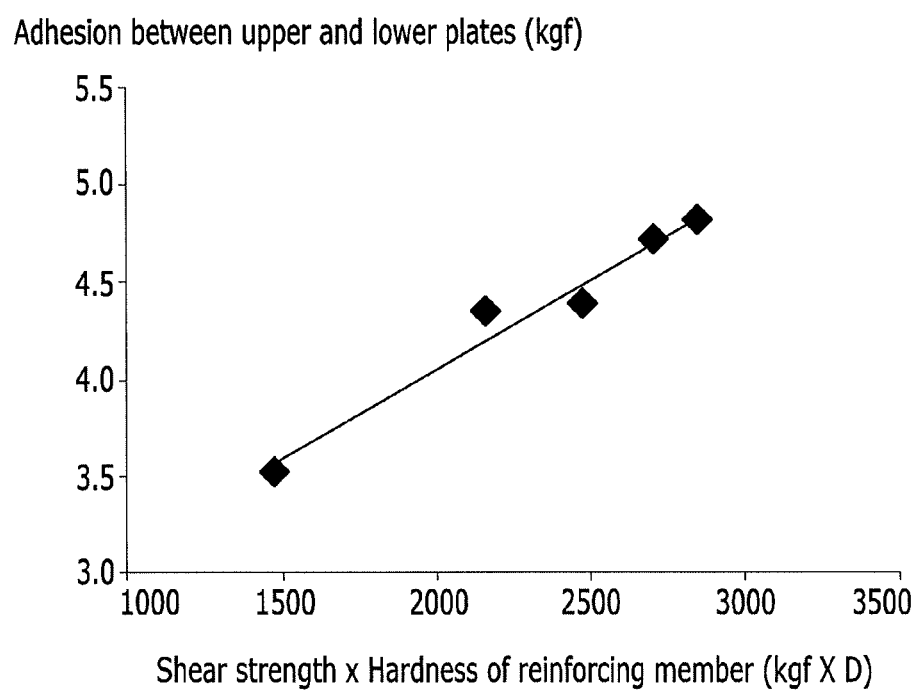
FIG. 7 illustrates a graph of adhesion for hardness of the reinforcing member multiplied by shear strength.

Referring to FIG. 7, the adhesion versus the hardness multiplied by the shear strength of the reinforcing member was shown to linearly increase. That is, the adhesion is not the characteristic increased depending on only one of the shear strength and the hardness, but is a characteristic determined depending on both the hardness and the shear strength.

As shown in FIG. 7, the adhesion was increased with the value of the hardness multiplied by the shear strength. Accordingly, the adhesion may be determined by both the shear strength and the hardness.

The reinforcing member according to an exemplary embodiment may increase adhesion by controlling shear strength and hardness. In particular, required values of the shear strength and the hardness of the reinforcing member may be derived according to thicknesses of the display substrate and the sealing member, required adhesion, or the like to provide the reinforcing member having appropriate properties.

The properties of the reinforcing member required in the display device may be determined according to Equation 1.

$$X \geq \frac{(Y - B \times t + C)}{A} \quad \text{Equation 1}$$

Here, X is shear strength multiplied by hardness of the reinforcing member, Y is required adhesion, t is a sum of thicknesses of the display substrate and the sealing member, and A, B, and C are constants.

When adhesion required in each display device exists, a minimum value of shear strength multiplied by hardness required for the reinforcing member may be derived by substituting the corresponding value and the sum of the thicknesses of the display substrate and the sealing member, respectively. Accordingly, the display device may provide appropriate adhesion by using the reinforcing member within a range of the minimum value or more of the corresponding shear strength multiplied by hardness.

In this case, A, B, and C are constants, and may have values in a range to be described below.

A may be about 0.0008 to about 0.0010, and in particular, 0.0009. B may be about 6.0000 to about 7.40000, and in particular, 6.6735. C may be about 0.7900 to about 0.9800, and in particular, 0.8866.

The adhesion Y required in the display device may be about 5.0 or more, and in particular, about 5.5 or more.

Further, exemplary embodiments may be used in a display device where a thickness of the display substrate is slightly small, and the sum of the thicknesses of the display substrate and the sealing member may be about 0.6 mm or less.

Hereinafter, referring to Table 3, according to an exemplary embodiment, the reinforcing member satisfying the Equation will be described. In this embodiment, A is 0.0009 B is 6.6735, and C is 0.8866.

TABLE 3

| Sum of thicknesses of display substrate and sealing member | Shear strength × Hardness | |
| --- | --- | --- |
| | Required adhesion of 5.0 kgf | Required adhesion of 5.5 kgf |
| 0.2 mm | 3087 kgf × D | 3643 kgf × D |
| 0.3 mm | 2346 kgf × D | 2902 kgf × D |
| 0.35 mm | 1975 kgf × D | 2531 kgf × D |
| 0.4 mm | 1604 kgf × D | 2160 kgf × D |
| 0.45 mm | 1234 kgf × D | 1789 kgf × D |

When the adhesion required for the display device is 5.0 kgf, as a sum t of thicknesses of the display substrate and the sealing member varies, the value of shear strength multiplied by hardness required for the reinforcing member varies. As t is decreased, the required value of shear strength multiplied by hardness may be large. As an example, when t is 0.2, if the adhesion is 5.0 kgf, the value of shear strength multiplied by hardness of the reinforcing member may be 3087 or more. The required value may be changed according to t, and, as illustrated in Table 3, as t is increased, the required value of shear strength multiplied by hardness is decreased.

Further, when the adhesion required for the display device is 5.5 kgf, as the sum t of thicknesses of the display substrate and the sealing member varies, the value of shear strength multiplied by hardness required for the reinforcing member varies. As an example, when t is 0.2, if the adhesion is 5.5 kgf, the value of shear strength multiplied by hardness of the reinforcing member may be 3643 or more.

The aforementioned values are only examples, and a reinforcing member having adhesion required for the corresponding display device and a property (value of shear strength× hardness) required according to the thickness t may be selected.

Accordingly, the organic light emitting diode display including the corresponding reinforcing member may provide improved reliability and excellent device strength through stable adhesion.

Figure 8:
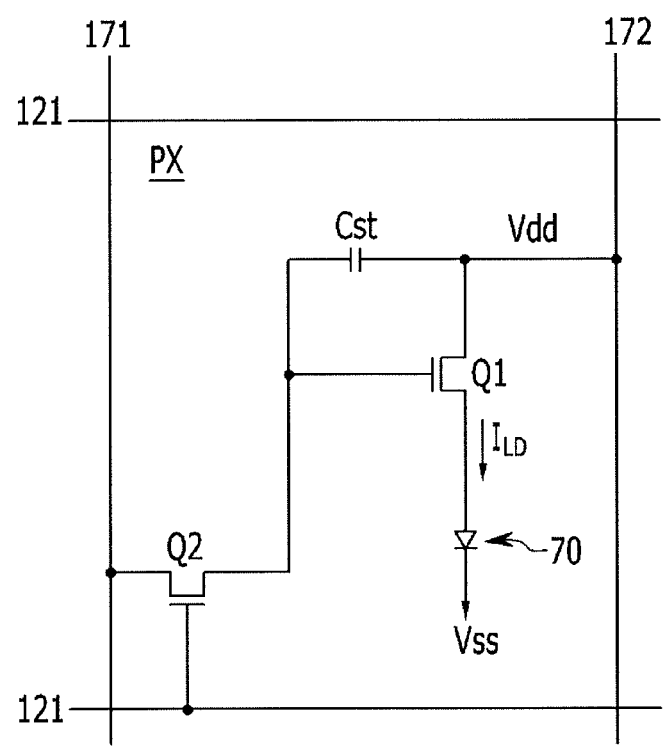
FIG. 8 illustrates an equivalent circuit diagram of one pixel of a display unit according to an exemplary embodiment.
Figure 9:
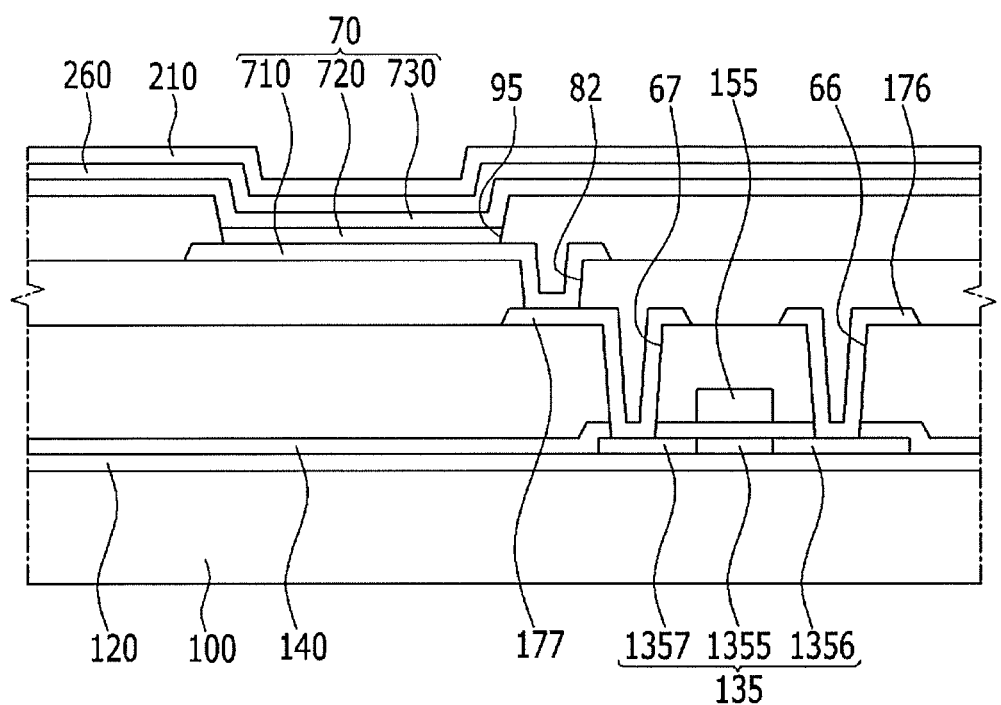
FIG. 9 illustrates a cross-sectional view of one pixel of the organic light emitting diode display of FIG. 8.

The organic light emitting diode display of FIGS. 1 and 2 may include a plurality of pixels each including an equivalent circuit illustrated in FIG. 8. FIG. 8 illustrates an equivalent circuit diagram of one pixel of a display unit according to the exemplary embodiment, and FIG. 9 illustrates a cross-sectional view of one pixel of the organic light emitting diode display of FIG. 8.

Referring to FIG. 8, the organic light emitting diode display according to the exemplary embodiment may include a plurality of signal lines 121 and 171, and a plurality of pixels P connected thereto and arranged substantially in a matrix form.

The signal lines may include a plurality of first signal lines 121 transferring gate signals (or scanning signals), a plurality of second signal lines 171 transferring data signals, and a plurality of third signal lines 172 transferring driving voltages Vdd. The first signal lines 121 may extend substantially in a row direction and may be substantially parallel to each other, and the second signal lines 171 and the third signal lines 172 may cross the first signal lines 121 to extend in a column direction and may be substantially parallel to each other.

Each pixel P may include a switching thin film transistor Q2, a driving thin film transistor Q1, a storage capacitor Cst, and an organic light emitting diode (OLED) 70.

The switching thin film transistor Q2 may have a control terminal, an input terminal, and an output terminal. The control terminal may be connected to the first signal line 121, the input terminal may be connected to the second signal line 171, and the output terminal may be connected to the driving thin film transistor Q1. The switching thin film transistor Q2 may transfer the data signal applied to the second signal line 171 to the driving thin film transistor Q1 in response to the scanning signal applied to the first signal line 121.

The driving thin film transistor Q1 may also have a control terminal, an input terminal, and an output terminal. The control terminal may be connected to the switching thin film transistor Q2, the input terminal may be connected to the third signal line 172, and the output terminal may be connected to the organic light emitting diode 70. The driving thin film transistor Q1 may provide an output current $I_{LD}$ with a varying amplitude according to a voltage applied between the control terminal and the output terminal.

The capacitor Cst may be connected between the control terminal and the input terminal of the driving thin film transistor Q1. The capacitor Cst may charge the data signal applied to the control terminal of the driving thin film transistor Q1, and may maintain the charged data signal even after the switching thin film transistor Q2 is turned off.

The organic light emitting diode 70 may have an anode connected to the output terminal of the driving thin film transistor Q1, and a cathode connected to a common voltage Vss. The organic light emitting diode 70 may emit light by varying an intensity according to the output current $I_{LD}$ of the driving thin film transistor Q1 to display an image.

FIG. 9 illustrates a cross-sectional view of one pixel of the organic light emitting diode display of FIG. 8. In FIG. 9, the second thin film transistor Q2 and the organic light emitting diode 70 of FIG. 8 will be described in detail according to a lamination order. Hereinafter, the second thin film transistor Q2 is referred to as a thin film transistor.

As illustrated in FIG. 9, the organic light emitting diode display includes a substrate 110, and a buffer layer 120 formed on the substrate 110.

The buffer layer 120 may be formed in a single layer of silicon nitride (SiNx) or in a double-layer structure in which silicon nitride (SiNx) and silicon oxide (SiO$_2$) are laminated. The buffer layer 120 may serve to planarize a surface while preventing an unnecessary component such as an impurity or moisture from permeating.

A semiconductor 135 that may be made of polysilicon may be formed on the buffer layer 120.

The semiconductor 135 may be divided into a channel region 1355, a source region 1356, and a drain region 1357 formed at both sides of the channel region 1355. The channel region 1355 of the semiconductor may be a polysilicon in which an impurity is not doped, that is, an intrinsic semiconductor. The source region 1356 and the drain region 1357 may be polysilicon in which a conductive impurity is doped, that is, an impurity semiconductor. The impurity doped in the source region 1356 and the drain region 1357 may be either a p-type impurity or an n-type impurity.

A gate insulating layer 140 may be formed on the semiconductor 135. The gate insulating layer 140 may be a single layer or a multilayer including at least one of tetra ethyl ortho silicate (TEOS), silicon nitride, and silicon oxide.

A gate electrode 155 may be formed on the semiconductor 135, and the gate electrode 155 may be overlapped by the channel region 1355.

The gate electrode 155 may be formed in a single layer or a multilayer of a low resistance material such as Al, Ti, Mo, Cu, Ni, or an alloy thereof or a material having strong corrosion resistance.

A first interlayer insulating layer 160 may be formed on the gate electrode 155. The first interlayer insulating layer 160 may be formed in a single layer or a multilayer of tetra ethyl ortho silicate (TEOS), silicon nitride, silicon oxide, or the like, as may be the gate insulating layer 140.

A source contact hole 66 and a drain contact hole 67 exposing the source region 1356 and the drain region 1357, respectively, may be included in the first interlayer insulating layer 160 and the gate insulating layer 140.

A source electrode 176 and a drain electrode 177 may be formed on the first interlayer insulating layer 160. The source electrode 176 may be connected to the source region 1356 through the contact hole 66, and the drain electrode 177 may be connected to drain region 1357 through the contact hole 67.

The source electrode 176 and the drain electrode 177 may be formed in a single layer or a multilayer of a low resistance material such as Al, Ti, Mo, Cu, Ni, or an alloy thereof or a material having strong corrosion resistance. For example, the source electrode 176 and the drain electrode 177 may be a triple layer of Ti/Cu/Ti, Ti/Ag/Ti, and Mo/Al/Mo.

The gate electrode 155, the source electrode 176, and the drain electrode 177 may be a control electrode, an input electrode, and an output electrode of FIG. 1, respectively, to form the thin film transistor together with the semiconductor 135. A channel of the thin film transistor may be formed in the semiconductor 135 between the source electrode 176 and the drain electrode 177.

A second interlayer insulating layer 180 may be formed on the source electrode 176 and the drain electrode 177. The second interlayer insulating layer 180 may include a contact hole 85 exposing the drain electrode 177.

The second interlayer insulating layer 180 may be formed in a single layer or a multilayer of tetra ethyl ortho silicate (TEOS), silicon nitride, silicon oxide, or the like, like the first interlayer insulating layer, and may be made of a low dielectric organic material.

A first electrode 710 is formed on the second interlayer insulating layer 180. The first electrode 710 may be electrically connected with the drain electrode 177 through the contact hole 85, and may be an anode of the organic light emitting diode.

In the exemplary embodiment, an interlayer insulating layer may be formed between the first electrode 710 and the drain electrode 177, but the first electrode 710 may be formed in the same layer as the drain electrode 177, and may be integrally formed with the drain electrode 177.

A pixel defining layer 190 may be formed on the first electrode 710. The pixel defining layer 190 may have an opening 95 exposing the first electrode 710. The pixel defining layer 190 may include a resin such as a polyacrylate or polyimide, a silica-based inorganic material, or the like.

An organic emission layer 720 may be formed in the opening 95 of the pixel defining layer 190.

The organic emission layer 720 may be formed in a multilayer including an emission layer, and one or more of a hole-injection layer (HIL), a hole-transporting layer (HTL), an electron-transporting layer (ETL), and an electron-injection layer (EIL).

In the case where the organic emission layer 720 includes all the layers, the hole-injection layer may be positioned on the pixel electrode 710 which is an anode, and the hole-transporting layer, the emission layer, the electron-transporting layer, and the electron-injection layer may be sequentially laminated thereon.

In this case, the emission layer may be made of a low-molecular organic material or a high-molecular organic material such as poly 3,4-ethylenedioxythiophene (PEDOT). The emission layer may include a red emission layer emitting red light, a green emission layer emitting green light, and a blue emission layer emitting blue light. The red emission layer, the green emission layer, and the blue emission layer may be formed in a red pixel, a green pixel, and a blue pixel, respectively, thereby implementing a color image.

Further, the emission layer may implement the color image by laminating the red emission layer, the green emission layer, and the blue emission layer together in the red pixel, the green pixel, and the blue pixel and forming a red color filter, a green color filter, and a blue color filter for each pixel. As another example, white emission layers emitting white light are formed in all of the red pixel, the green pixel, and the blue pixel, and a red color filter, a green color filter, and a blue color filter are formed for each pixel, thereby implementing the color image. In the case of implementing the color image by using the white emission layers and the color filters, a deposition mask for depositing the red emission layer, the green emission layer, and the blue emission layer on respective pixels, that is, the red pixel, the green pixel, and the blue pixel may not be used.

Further, the white emission layers may be formed as one emission layer emitting white light, and the white light may be emitted by laminating a plurality of emission layers emitting different color light. For example, the white emission layer may also include a configuration which may emit white light by combining at least one yellow emission layer and at least one blue emission layer, a configuration which may emit white light by combining at least one cyan emission layer and at least one red emission layer, a configuration which may emit white light by combining at least one magenta emission layer and at least one green emission layer, or the like.

A second electrode 730 may be formed on the pixel defining layer 190 and the organic emission layer 720.

The second electrode 730 may be a cathode of the organic light emitting diode. Accordingly, the first electrode 710, the organic emission layer 720, and the second electrode 730 may form an organic light emitting diode 70.

The organic light emitting diode display may have a structure including a top display type, a bottom display type, or a both-side display type according to a direction in which the organic light emitting diode 70 emits the light.

A reflective layer and a translucent layer may be made of one or more metals of magnesium (Mg), silver (Ag), gold (Au), calcium (Ca), lithium (Li), chromium (Cr), and aluminum (Al), or an alloy thereof. The reflective layer and the translucent layer may be determined by a thickness, and the translucent layer may be formed at a thickness of 200 nm or less. As the thickness is decreased, transmittance of light may be increased, but when the thickness is very small, the resistance may be increased.

A transparent layer may be made of a material of indium tin oxide (ITO), indium zinc oxide (IZO), zinc oxide (ZnO), indium oxide ($In_2O_3$), or the like.

Next, an encapsulation member 260 may be formed on the second electrode 730.

The encapsulation member 260 may be formed by alternately laminating at least one organic layer and at least one inorganic layer. A plurality of inorganic layers or organic layers may be laminated, respectively.

The organic layer may be made of polymer, and in particular, may be a single layer or a laminated layer formed from any one of polyethylene terephthalate, polyimide, polycarbonate, epoxy, polyethylene, and polyacrylate. In addition, the organic layer may be formed from polyacrylate, and may include a material in which a monomer composition including diacrylate-based monomers and triacrylate-based monomers is polymerized. Monoacrylate-based monomers may be further included in the monomer composition. A known photoinitiator such as TPO may be further included in the monomer composition, but embodiments are not limited thereto.

The inorganic layer may be a single layer or a laminated layer including metal oxide or metal nitride. In detail, the inorganic layer may include any one of SiNx, $Al_2O_3$, $SiO_2$, and $TiO_2$.

A top layer of an encapsulation layer exposed to the outside may be formed as an inorganic layer to prevent moisture from penetrating to the organic light emitting diode.

The encapsulation layer may include at least one sandwich structure in which at least one organic layer is inserted between at least two inorganic layers. Further, the encapsulation layer may include at least one sandwich structure in which at least one inorganic layer is inserted between at least two organic layers.

The encapsulation layer may include a first inorganic layer, a first organic layer, and a second inorganic layer in sequence from the top of the display unit. Further, the encapsulation layer may include a first inorganic layer, a first organic layer, a second inorganic layer, a second organic layer, and a third inorganic layer in sequence from the top of the display unit. Further, the encapsulation layer may include a first inorganic layer, a first organic layer, a second inorganic layer, a second organic layer, a third inorganic layer, a third organic layer, and a fourth inorganic layer in sequence from the top of the display unit.

A halogenated metal layer including LiF may be additionally included between the display unit and the first inorganic layer. The halogenated metal layer may prevent the display unit from being damaged when the first inorganic layer is formed by a sputtering method or a plasma deposition method.

An area of the first organic layer may be smaller than that of the second inorganic layer, and an area of the second organic layer may also be smaller than that of the third inorganic layer. Further, the first organic layer may be fully covered by the second inorganic layer, and the second organic layer may also be fully covered by the third inorganic layer.

By way of summation and review, because the organic light emitting diode display has a self-emission characteristic and does not require a separate light source, unlike a liquid crystal display, it is possible to reduce a thickness and a weight of the organic light emitting display. Further, because the organic light emitting diode display may have characteristics such as low power consumption, high luminance, and a high response speed, the organic light emitting diode display has received attention as a next-generation display device for portable electronic apparatuses. In general, the organic light emitting diode display may include a display substrate with the organic light emitting diodes, and a sealing member covering the display substrate. The display substrate and the sealing member may be sealed to each other by a sealant and a reinforcing member.

As a thickness of the display substrate is decreased, bonding of the substrate maintained by the sealant and the reinforcing member may need to be reinforced.

In contrast, exemplary embodiments provide an organic light emitting diode display having advantages of maintaining vertical adhesion between substrates of a predetermined level or more, which is required as a thickness of a display substrate is decreased. That is, the reinforcing member according to exemplary embodiments increases the adhesion by controlling the shear strength and hardness.

Accordingly, an organic light emitting diode display may be made in which the hardness and the shear strength of the reinforcing member are determined according to required adhesion and a substrate thickness. Although the thickness of the bonded substrate is decreased, a reinforcing member which may maintain adhesion at a predetermined level or more may be selected. Therefore, it is possible to provide improved reliability and device strength of the organic light emitting diode display.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

| <Description of symbols> | |
| --- | --- |
| 10: Display device | 110: Substrate |
| 120: Buffer layer | 121: Signal line |
| 135: Semiconductor | 1355: Channel region |
| 1356: Source region | 1357: Drain region |
| 140: Gate insulating layer | 155: Gate electrode |
| 160: Insulating layer | 171, 172: Signal line |
| 176: Source electrode | 177: Drain electrode |
| 210: Sealing member | 260: Encapsulation member |
| 350: Sealant | 360: Reinforcing member |
| 710: First electrode | 720: Organic emission layer |
| 730: Second electrode | |

What is claimed is:

1. An organic light emitting diode display, comprising:
   a display substrate including an organic light emitting diode;
   a sealing member facing the display substrate to cover the organic light emitting diode;
   a sealant positioned between the display substrate and the sealing member and bonding the display substrate and the sealing member; and
   a reinforcing member positioned at an outer surface of the sealant at a space between the display substrate and the sealing member, wherein:

$$X \geq \frac{(Y - B \times t + C)}{A}$$

wherein X is a shear stress of the reinforcing member multiplied by a hardness (D) of the reinforcing member, Y is an adhesion force (kgf) between the display substrate and the sealing member, t is a sum of thicknesses of the display substrate and the sealing member (millimeters), A is about 0.0008 to about 0.0010, B is about 6.0000 to about 7.40000, and C is about 0.7900 to about 0.9800.

2. The organic light emitting diode display as claimed in claim 1, wherein:
   Y is about 5.0 or more.

3. The organic light emitting diode display as claimed in claim 1, wherein:
   the sum of thicknesses of the display substrate and the sealing member is about 0.6 mm or less.

4. The organic light emitting diode display as claimed in claim 1, wherein:
   the outer surface of the sealant and an edge of the sealing member are parallel to each other.

5. The organic light emitting diode display as claimed in claim 1, wherein:
   the sealant includes at least one of a frit and an epoxy resin.

6. The organic light emitting diode display as claimed in claim 1, wherein:
   the sealant is formed by a screen printing method.

7. The organic light emitting diode display as claimed in claim 1, wherein:
   the reinforcing member is formed by capillary action.

* * * * *